US010904471B2

(12) United States Patent
Matsumoto et al.

(10) Patent No.: US 10,904,471 B2
(45) Date of Patent: Jan. 26, 2021

(54) FEATURE EXTRACTION ELEMENT, FEATURE EXTRACTION SYSTEM, AND DETERMINATION APPARATUS

(71) Applicant: NIKON CORPORATION, Tokyo (JP)

(72) Inventors: Shigeru Matsumoto, Sagamihara (JP); Sota Nakanishi, Kawasaki (JP); Tomohisa Ishida, Tokyo (JP); Atsushi Miyamoto, Fujisawa (JP); Kiyoshi Uchikawa, Tsukuba (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/145,875

(22) Filed: Sep. 28, 2018

(65) Prior Publication Data

US 2019/0034748 A1    Jan. 31, 2019

Related U.S. Application Data

(63) Continuation of application No. PCT/JP2016/060574, filed on Mar. 30, 2016.

(51) Int. Cl.
*H04N 5/369* (2011.01)
*G06N 3/04* (2006.01)
(Continued)

(52) U.S. Cl.
CPC ............. *H04N 5/379* (2018.08); *G06K 9/209* (2013.01); *G06K 9/46* (2013.01); *G06K 9/78* (2013.01);
(Continued)

(58) Field of Classification Search
None
See application file for complete search history.

(56) References Cited

U.S. PATENT DOCUMENTS 6,617,565 B2    9/2003    Wu
2007/0244842 A1    10/2007    Ishii et al.
(Continued)

FOREIGN PATENT DOCUMENTS

JP    10-294899 A    11/1998
JP    2000-333083    11/2000
(Continued)

OTHER PUBLICATIONS

International Search Report dated Jun. 28, 2016 in corresponding International Patent Application No. PCT/JP2016/060574.
(Continued)

*Primary Examiner* — Twyler L Haskins
*Assistant Examiner* — Wesley J Chiu

(57) ABSTRACT

A feature extracting element including: a light-receiving substrate where a plurality of light-receiving elements for photoelectrically converting received light are two-dimensionally arrayed; and one or more other substrates that are laminated on the light-receiving substrate, wherein the other substrate has: a convolution processor which has a plurality of multiplying circuits that are correspondingly provided per the light-receiving element or per a block that is configured of a plurality of the light-receiving elements, and performs convolution operation on signals that are output from the plurality of light-receiving elements using the plurality of multiplying circuits; a pooling processing unit to sample a signal that is output from the convolution processor, based on a predetermined condition; and a connection wiring to pass the sampled signal to the plurality of multiplying circuits.

13 Claims, 9 Drawing Sheets

(51) Int. Cl.
| | |
|---|---|
| *H04N 5/3745* | (2011.01) |
| *H01L 27/146* | (2006.01) |
| *G06N 3/063* | (2006.01) |
| *G06K 9/20* | (2006.01) |
| *G06K 9/46* | (2006.01) |
| *G06K 9/78* | (2006.01) |
| *H04N 5/378* | (2011.01) |

(52) U.S. Cl.
CPC ......... *G06N 3/0454* (2013.01); *G06N 3/0481* (2013.01); *G06N 3/0635* (2013.01); *H01L 27/14634* (2013.01); *H01L 27/14636* (2013.01); *H04N 5/369* (2013.01); *H04N 5/378* (2013.01); *H04N 5/3745* (2013.01); *H04N 5/37455* (2013.01)

(56) References Cited

U.S. PATENT DOCUMENTS

| | | | | |
|---|---|---|---|---|
| 2008/0042046 | A1* | 2/2008 | Mabuchi | H01L 27/14634 250/208.1 |
| 2008/0180534 | A1 | 7/2008 | Murayama | |
| 2008/0284888 | A1* | 11/2008 | Kobayashi | H04N 5/37455 348/308 |
| 2010/0276572 | A1 | 11/2010 | Iwabuchi et al. | |
| 2012/0007038 | A1* | 1/2012 | Strukov | H01L 27/105 257/5 |
| 2012/0133807 | A1* | 5/2012 | Wu | H04N 5/37455 348/272 |
| 2013/0236048 | A1* | 9/2013 | Vazquez | G06K 9/00986 382/103 |
| 2014/0354778 | A1* | 12/2014 | Kolar | H04N 5/2254 348/46 |
| 2015/0163425 | A1* | 6/2015 | Oganesian | H04N 5/374 348/302 |
| 2015/0178246 | A1* | 6/2015 | Herrero Abellanas | G06F 17/153 708/300 |
| 2015/0332126 | A1* | 11/2015 | Hikida | H04N 5/23229 348/223.1 |
| 2016/0026912 | A1* | 1/2016 | Falcon | G06N 3/0454 706/25 |
| 2016/0342874 | A1* | 11/2016 | Powell | G06K 19/06037 |
| 2016/0373629 | A1* | 12/2016 | Jung | H04N 5/2254 |
| 2017/0054931 | A1* | 2/2017 | Wang | H04N 5/365 |
| 2017/0103298 | A1* | 4/2017 | Ling | G06N 3/0454 |
| 2017/0155865 | A1* | 6/2017 | Nakajima | H04N 5/374 |
| 2018/0239108 | A1* | 8/2018 | Ishii | G02B 7/34 |

FOREIGN PATENT DOCUMENTS

| | | |
|---|---|---|
| JP | 2003-23573 | 1/2003 |
| JP | 2005-346472 | 12/2005 |
| JP | 2008-148298 | 6/2008 |
| JP | 2016-33806 | 3/2016 |
| WO | 2006/022077 A1 | 3/2006 |
| WO | 2006/129762 A1 | 12/2006 |
| WO | 2015/078018 A1 | 6/2015 |

OTHER PUBLICATIONS

Written Opinion of the International Searching Authority dated Jun. 28, 2016 in corresponding International Patent Application No. PCT/JP2016/060574.
Ángel Rodríguez-Vázquez, et al., "A 3D chip architecture for optical sensing and concurrent processing", Proceedings of SPIE, vol. 7726, Optical Sensing and Detection, May 13, 2010, XP055626072, doi: 10.117/12.855027, 13 pages.
Manuel Suárez, et al., "CMOS-3D Smart Imager Architectures for Feature Detection", IEEE Journal on Emerging and Selected Topics in Circuits and Systems, vol. 2, No. 4, Dec. 2012, XP011479510, pp. 723-736.
Kazumasa Kioi, et al., "Design and Implementation of a 3D-LSI Image Sensing Processor", IEEE Journal of Solid-State Circuits, vol. 27, No. 8, Aug. 1992, XP000309392, pp. 1130-1140.
M. Suárez, et al., "A CMOS-3D Reconfigurable Architecture with In-pixel Processing for Feature Detectors", 3D Systems Integration Conference (3DIC), 2011 IEEE International, Jan. 2012, XP032235085, pp. 1-8.
Péter Földesy, et al., "Configurable 3D-integrated focal-plane cellular sensor-processor array architecture", International Journal of Circuit Theory and Applications, vol. 36, Jul. 2008, XP055625910, pp. 573-588.
Extended European Search Report dated Oct. 18, 2019 in corresponding European Patent Application No. 16896883.2.
Communication under Article 94(3) EPC dated Apr. 20, 2020, in European Patent Application No. 16896883.2 (six pages).
First Office Action dated Mar. 25, 2020, in Chinese Patent Application No. 201680083514.5 (six pages including translation).
Office Action dated Jul. 14, 2020, in Japanese Patent Application No. 2019-110274 and English translation obtained from Global Dossier (18 pages in total).

* cited by examiner

FEATURE EXTRACTION ELEMENT, FEATURE EXTRACTION SYSTEM, AND DETERMINATION APPARATUS

The contents of the following International patent application are incorporated herein by reference:
PCT/JP2016/060574 filed on Mar. 30, 2016.

BACKGROUND

1. Technical Field

The present invention relates to a feature extracting element, a feature extracting system, and a judging apparatus.

2. Related Art

There are some methods for accelerating feature extraction processing by performing it per each of blocks which are obtained by dividing an image into blocks (refer to Patent Document 1, for example).
Patent Document 1: Japanese Patent Application Publication No. 2008-148298
Since the feature extraction is performed by processing data that is captured as an image, it takes much time for processing for generating the image, processing for transferring the generated image and the like, and thus the feature extraction processing has not been regarded accelerated enough.

General Disclosure

The first aspect of the present invention provides a feature extracting element including: a light-receiving substrate where a plurality of light-receiving elements for photoelectrically converting received light are two-dimensionally arrayed; and one or more other substrates that are laminated on the light-receiving substrate, wherein the other substrate has: a convolution processing unit which has a plurality of multiplying circuits that are correspondingly provided per the light-receiving element or per a block that is configured of a plurality of the light-receiving elements, and performs convolution operation on signals that are output from the plurality of light-receiving elements using the plurality of multiplying circuits; a pooling processing unit to sample a signal that is output from the convolution processing unit, based on a predetermined condition; and a connection wiring to pass the sampled signal to the plurality of multiplying circuits.

The second aspect of the present invention provides a feature extracting system including: the feature extracting element described above; and a controlling unit to control such that convolution operation of the convolution processing unit and sampling of the pooling processing unit are repeated, wherein the controlling unit controls, when the convolution operation is repeated, the convolution processing unit such that predetermined filter coefficients are respectively used.

The third aspect of the present invention provides a judging apparatus including: the feature extracting element described above; and a judging unit to judge an image-capturing target by feature quantity that is extracted based on an output from the pooling processing unit.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
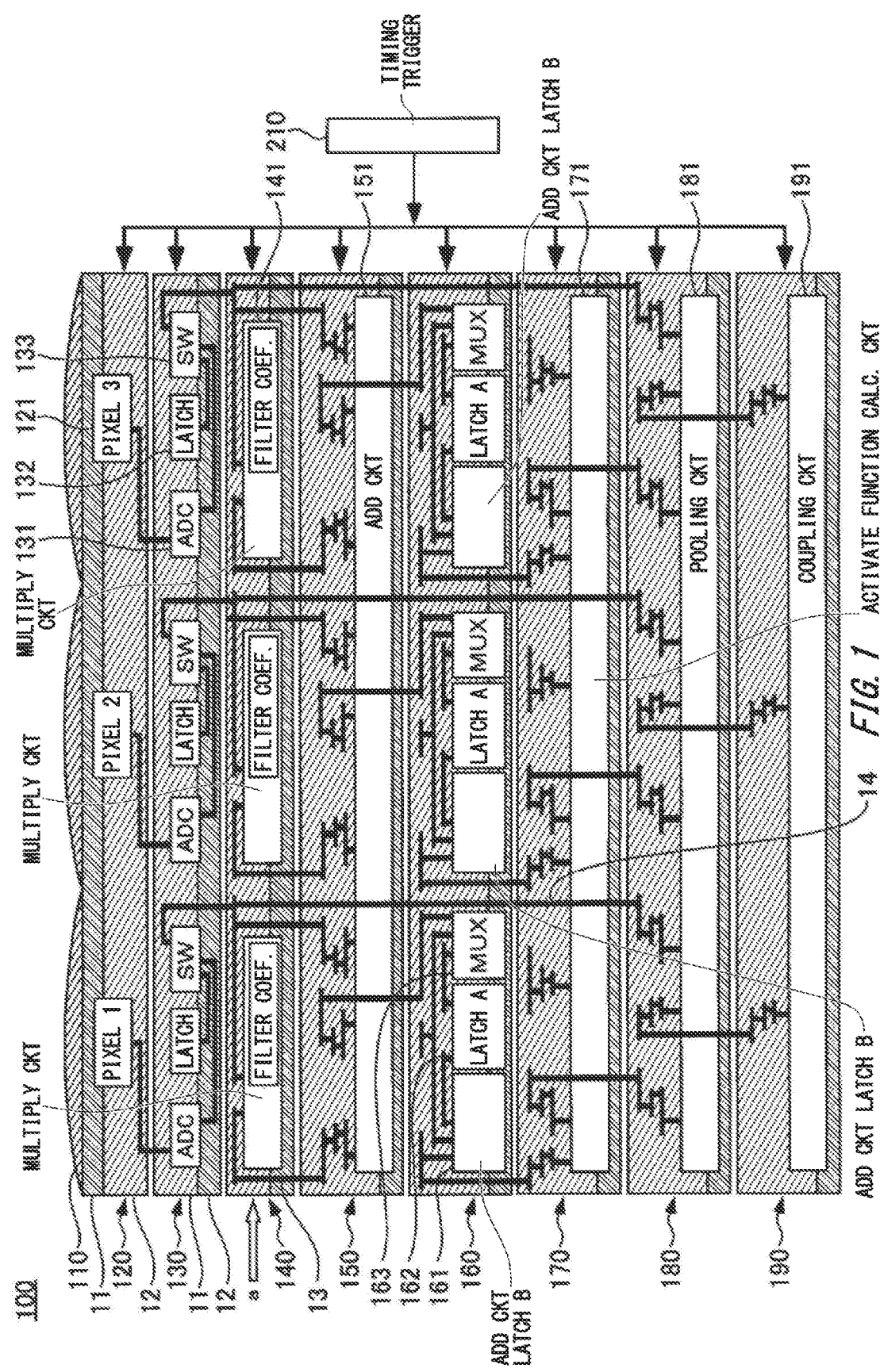
FIG. 1 is a schematic cross-sectional view of a feature extracting apparatus 100.

FIG. 1 is a schematic cross-sectional view of the feature extracting apparatus 100. The feature extracting apparatus 100 is a single element including: microlenses 110, a pixel substrate 120, an AD conversion circuit substrate 130, a multiplying circuit substrate 140, an adding circuit substrate 150, a convolution operation result adding substrate 160, an activation function calculating circuit substrate 170, a pooling circuit substrate 180, and a coupling circuit substrate 190, which are laminated sequentially.

Note that the feature extracting apparatus 100 extracts feature quantity to use for judging an object from received an object luminous flux. The judging an object includes, for an example, identifying what the object is, identifying what category the object falls in, and judging what degree the object is in (e.g. sunset degree, etc.), but not limited to these. The feature quantity extracted here corresponds to features extracted by multi-layer neural networks that are referred to as deep learning. In other words, the feature extracting apparatus 100 can be used for learning processing to extract features by deep learning.

The substrates in the feature extracting apparatus 100 each have wiring layers 12 respectively which are formed on base substrates 11 by photolithography. Each wiring layer 12 includes circuits that are configured of wirings, elements, etc. That is, a pixel substrate 120, an AD conversion circuit substrate 130, a multiplying circuit substrate 140, an adding circuit substrate 150, a convolution operation result adding substrate 160, an activation function calculating circuit substrate 170, a pooling circuit substrate 180, a coupling circuit substrate 190 have pixels 121, AD conversion circuits 131, multiplying circuits 141, an adding circuit 151, latch B-added adding circuits 161, an activation function calculating circuit 171, a pooling circuit 181, a coupling circuit 191, respectively.

Also, the substrates described above are electrically connected to other substrates that are laminated adjacent to each other via through-electrodes 13 penetrating each base substrate 11. Furthermore, a part of the substrates are electrically connected directly to substrates that are not adjacent to the substrates by through-electrodes 14 that are formed penetrating a plurality of substrates. The detail of this will be described referring to FIG. 3 and FIG. 4.

In the feature extracting apparatus 100, the pixel substrate 120 has a plurality of pixels 121 that are arranged two-dimensionally and periodically. Each pixel 121 has a light-receiving element such as a photodiode for photoelectrically converting entered light. Note that, in this example shown in the figure, the pixel substrate 120 is of backside irradiation-type, where the entering light is received from the base substrate side, by removing or making thin a substrate having been a base when the pixels 121 are formed.

Also, the pixel substrate 120 may have, in its respective light-receiving elements, transistors to instruct reset, transfer, and selection, and elements to amplify output signals. The microlenses 110 that are laminated on the pixel substrate 120 improve incident efficiency by condensing the entering light into the respective pixels 121.

The AD conversion circuit substrate 130 has a plurality of AD conversion circuits 131, latches 132, and change-over switches 133 which correspond to the respective pixels 121 of the pixel substrate 120. Thereby, the AD conversion circuit substrate 130 outputs, to the other substrates, either a value obtained by discretizing respective pixel values acquired from the pixels 121 of the pixel substrate 120 or a value held by the latch 132. The AD conversion circuits 131, the latches 132, and the change-over switches 133 operate upon a timing when receiving a timing trigger 210 received from outside.

The multiplying circuit substrate 140 has multiplying circuits 141 that correspond to the respective pixels 121 of the pixel substrate 120. In other words, the multiplying circuit substrate 140 has the same number of multiplying circuits 141 as that of pixels 121 provided in the pixel substrate 120. The multiplying circuit 141 is a digital multiplier, and may be configured of shift registers, for example. The multiplying circuit 141 acquires, from outside, a filter coefficient for performing the multiplication processing to be held.

In other words, the multiplying circuit 141 can perform different multiplication processing according to values of the filter coefficient read out from outside. FIG. 1 shows a case where a filter coefficient a is acquired, as an example. The multiplying circuits 141 in the multiplying circuit substrate 140 also operate upon the timing when receiving a timing trigger 210 received from outside.

Note that the multiplying circuit substrate 140 may have one of the multiplying circuits 141 per block that is configured of the plurality of pixels 121 of the pixel substrate 120. For example, if four pixels of the pixel 121 adjacent to each other in two-dimensional direction are regarded as one block, the multiplying circuit substrate 140 may have one multiplying circuit 141 that is connected to any of the four pixels 121 in the block. In this case, the multiplying circuit 141 performs multiplication processing sequentially upon an output from the respective four pixels 121 in the block.

The adding circuit 151 of the adding circuit substrate 150 sums up values acquired from the plurality of multiplying circuits 141 in the multiplying circuit substrate 140 and outputs the resultant value. The output of the adding circuit 151 can be output to the convolution operation result adding substrate 160 therebelow in the figure. The adding circuit 151 in the adding circuit substrate 150 operates upon the timing when receiving a timing trigger 210 received from outside.

The convolution operation result adding substrate 160 has latch B-added adding circuits 161, latches A 162, and multiplexers 163. The latch B-added adding circuits 161, the latches A 162, and the multiplexers 163 are connected to each other, and also, through the through-electrodes 13, the latch B-added adding circuits 161 are connected to the activation function calculating circuit substrate 170 whereas the multiplexers 163 are connected to the adding circuit substrate 150. The convolution operation result adding substrate 160 sums up a plurality of signals that are output from the adding circuit substrate 150, and then outputs the resultant to the activation function calculating circuit substrate 170.

The activation function calculating circuit substrate 170 has a corresponding number of activation function calculating circuit 171 to the number of the adding circuits 151 of the adding circuit substrate 150. The activation function calculating circuit substrate 170 performs, upon receiving an output of the adding circuit substrate 150, activation function operation, and then outputs the resultant to the pooling circuit substrate 180. The activation function calculating circuit 171 in the activation function calculating circuit substrate 170 operates upon the timing when receiving a timing trigger 210 received from outside.

The pooling circuit 181 of the pooling circuit substrate 180 and the coupling circuit 191 of the coupling circuit substrate 190 sequentially perform processing on the input from the previous step. The output value of the coupling circuit 191 in the coupling circuit substrate 190 can be output, as the feature quantity, to outside of the feature extracting apparatus 100. The pooling circuit 181 and the coupling circuit 191 also operate upon the timing when receiving a timing trigger 210 received from outside.

Note that, in the feature extracting apparatus 100 described above, the pixels 121, the AD conversion circuits 131, the latches 132, the change-over switches 133, the multiplying circuits 141, the adding circuit 151, the latch B-added adding circuits 161, the activation function calculating circuit 171, the pooling circuit 181, the coupling circuit 191, and the like are each controlled in their operation timing by a controlling unit not shown by the supplied timing trigger 210. This controlling unit may be included in the feature extracting apparatus 100, or a controlling unit of another apparatus including the feature extracting apparatus 100 therein, e.g. an imaging device, may be also used for this controlling unit. The feature extracting apparatus 100 that is a single element and the controlling unit configure a feature extracting system.

As described above, the feature extracting apparatus 100 has a structure where the multiplying circuit substrate 140, the adding circuit substrate 150, the convolution operation result adding substrate 160, the activation function calculating circuit substrate 170, the pooling circuit substrate 180, and the coupling circuit substrate 190 that are involved with feature extraction processing of images, are laminated on the pixel substrate 120 including the light-receiving element. Thereby, the feature extraction can be performed by directly processing pixel values, and thus the processing time can be shorten, thanks to elimination of processing for turning an image into data to be stored and processing for transferring the stored image data.

Also, hardware resources such as storage apparatuses, transfer apparatuses for image data can be eliminated, which contributes to miniaturization of a device including the feature extracting apparatus 100. Furthermore, processing substrates are laminated corresponding to the pixels of the pixel substrate 120, and thus the processing speed is prevented from decreasing while the number of pixels of the pixel substrate 120 increases.

Note that the feature extracting apparatus 100 described above receives entering light by the plurality of pixels 121 arrayed two-dimensionally, and thus can acquire, from the pixel substrate 120, two-dimensional luminance distribution information that is used for generating of the image data. Accordingly, the feature extracting apparatus 100 can be used as an image sensor.

Figure 2:
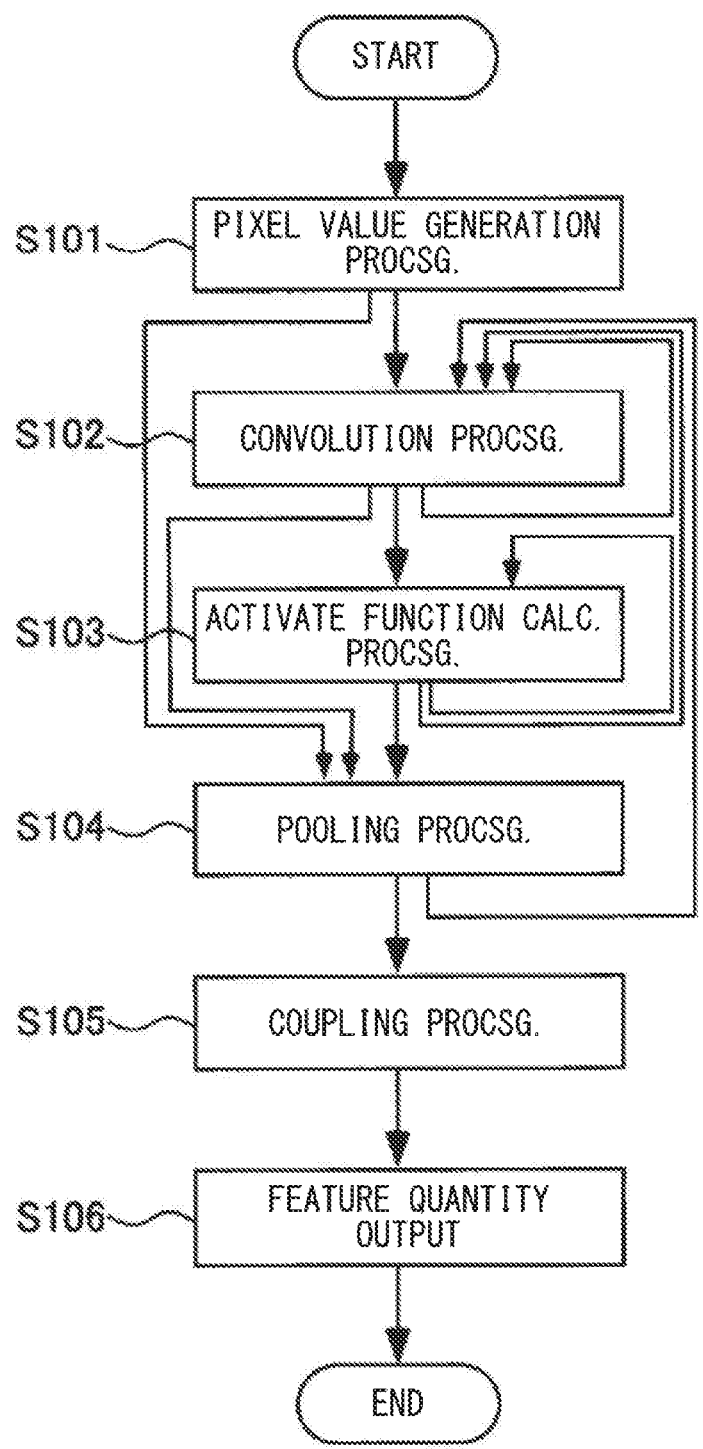
FIG. 2 is a flow chart of processing to be performed in the feature extracting apparatus 100.

FIG. 2 is a flow chart of feature extraction processing to be performed in the feature extracting apparatus 100. As shown in the figure, in the feature extraction processing on a pixel value generated by pixel value generation processing S101 convolution processing S102, activation function calculation processing S103, pooling processing S104, and coupling processing S105 are performed, and the extracted feature quantity is output to outside (step S106).

Here, in the feature extraction processing corresponding to deep learning, the pixel value generation processing S101 and the feature quantity output S106 are each performed once per one feature extraction. However, reading out filter function in convolution processing S102, the multiplication processing, and the adding processing are repeatedly performed many times repeatedly, with the filter coefficients to read out changing. Furthermore, the processing results of the activation function calculation processing S103 and the pooling processing S104 after the convolution processing are served again to the convolution processing S102, and processings from the convolution processing S102 to the pooling processing S104 are repeated more. Note that, in some cases, only the activation function calculation processing S103 is repeated, or the convolution processing S102 and the activation function calculation processing S103 are repeated; and in other cases, after the pixel value generation processing S101, the pooling processing S104 is performed, omitting either one or both of the convolution processing S102 and the activation function calculation processing S103.

Figure 3:
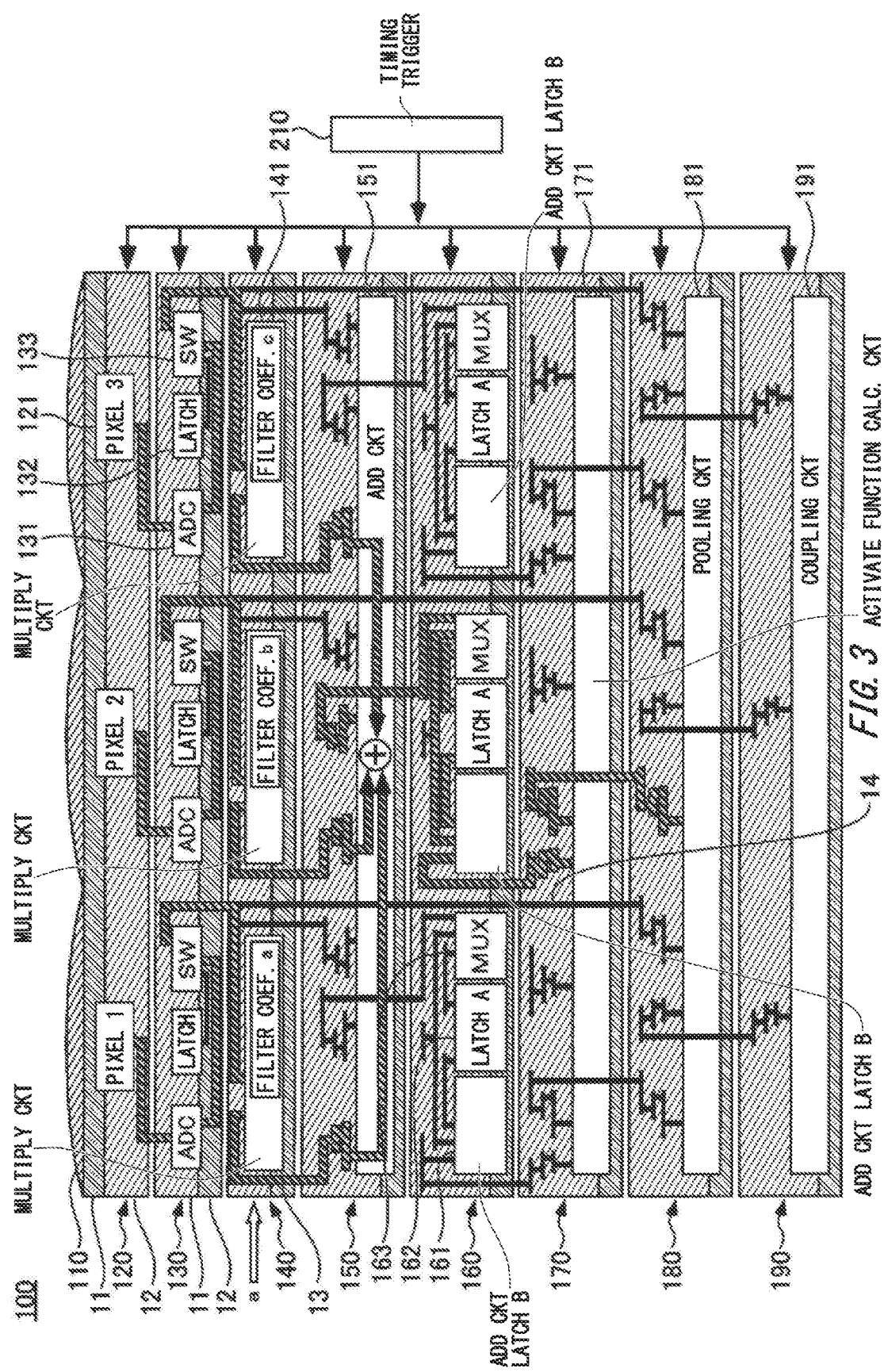
FIG. 3 is a schematic cross-sectional view of the feature extracting apparatus 100.

FIG. 3 is a view illustrating operations in the feature extracting apparatus 100 shown in FIG. 1. In the feature extracting apparatus 100 shown in the figure, a function of the through-electrodes 13 connecting the substrates adjacent to each other is indicated emphasized with a hatched bold line.

As indicated with the bold line in the figure, in the feature extracting apparatus 100, the pixel 1, the pixel 2 and the pixel 3 in the pixel substrate 120 are each connected to the corresponding AD conversion circuits 131 in the AD conversion circuit substrate 130, and to the corresponding multiplying circuits 141 in the multiplying circuit substrate 140 via the change-over switches 133.

On the other hand, the multiplying circuit substrate 140 acquires respective filter coefficients a, b, c of the multiplying circuits 141 corresponding to the pixels 1 to 3, respectively. The pixel value output by the pixel 1 in the pixel substrate 120 is, after multiplied using the filter coefficient a by the multiplying circuit 141 corresponding to the pixel 1 in the multiplying circuit substrate 140, input to the adding circuit substrate 150 through the through-electrode 13.

Similarly, the pixel value output by the pixel 2 in the pixel substrate 120 is, after multiplied using the filter coefficient b by the multiplying circuit 141 corresponding to the pixel 2 in the multiplying circuit substrate 140, input to the adding circuit substrate 150 through the through-electrode 13. Furthermore, the pixel value output by the pixel 3 in the pixel substrate 120 is, after multiplied using the filter coefficient c by the multiplying circuit 141 corresponding to the pixel 3 in the multiplying circuit substrate 140, input to the adding circuit substrate 150 through the through-electrode 13.

The adding circuit 151 in the adding circuit substrate 150 sums up the plurality of multiplied results that are input, and outputs the resultant to the convolution operation result adding substrate 160. In this manner, processing similar to filtering such as smoothing is performed. However, by filter coefficients in the multiplying circuits 141 being predetermined by pre-learning, the series of processings are performed as convolution processing.

The latches A 162 in the convolution operation result adding substrate 160 hold signals output from the adding circuit 151 via the multiplexers 163. Thereafter, upon multiplied by the multiplying circuits 141 with the filter coefficients set differently from the last time and the multiplied results are summed up in the adding circuit 151, the latch B-added adding circuits 161 hold the adding processing result of the adding circuit 151 via the multiplexers 163.

The latch B-added adding circuits 161 read out the last adding processing results that are held in the latches A 162 to add to new adding processing results, and the added results are again held by the latches A 162. By repeating this processing predetermined prescribed times, a plurality of processing results obtained by performing convolution operation on the pixels in the same group (the pixels 1 to 3) with different filter coefficients can be summed up. In other words, this corresponds to the repeated convolution processing S102 shown in FIG. 2. Such convolution operation is performed on all the pixels in the pixel substrate 120, that is, on the whole input image.

In the feature extracting apparatus 100, the processing result by the convolution operation result adding substrate 160 is input to the activation function calculating circuit 171 of the activation function calculating circuit substrate 170 through the through-electrode 13. The activation function calculating circuit 171 converts information that is passed from the convolution processing to the pooling processing. Such functions include, for example, a ReL U (Rectified Linear Unit) function as shown in Equation 1 below, where input values smaller than 0 are all turned into 0 whereas input values greater than 0 are returned as they are. $f(x) = \max(0, x)$ ... (Equation 1)

The output of the activation function calculating circuit 171 is passed to the pooling circuit 181 of the pooling circuit substrate 180 through the through-electrode 13. In the pooling circuit 181, subsampling is performed based on predetermined conditions. The conditions for the subsampling performed here include a condition, e.g. in Max Pooling method, where the maximum value at a window size is taken as a representative value.

Regarding the predetermined conditions, as long as the processing gathers a plurality of outputs from the activation function calculating circuit 171, the processing may be Average Pooling method to output the average value, or the like. In this manner, the processings from the convolution processing (step S102), the activation function calculation processing (step S103), to the pooling processing (step S104) are performed, and the subsampled value that is generated from the pixel values is generated.

Figure 4:
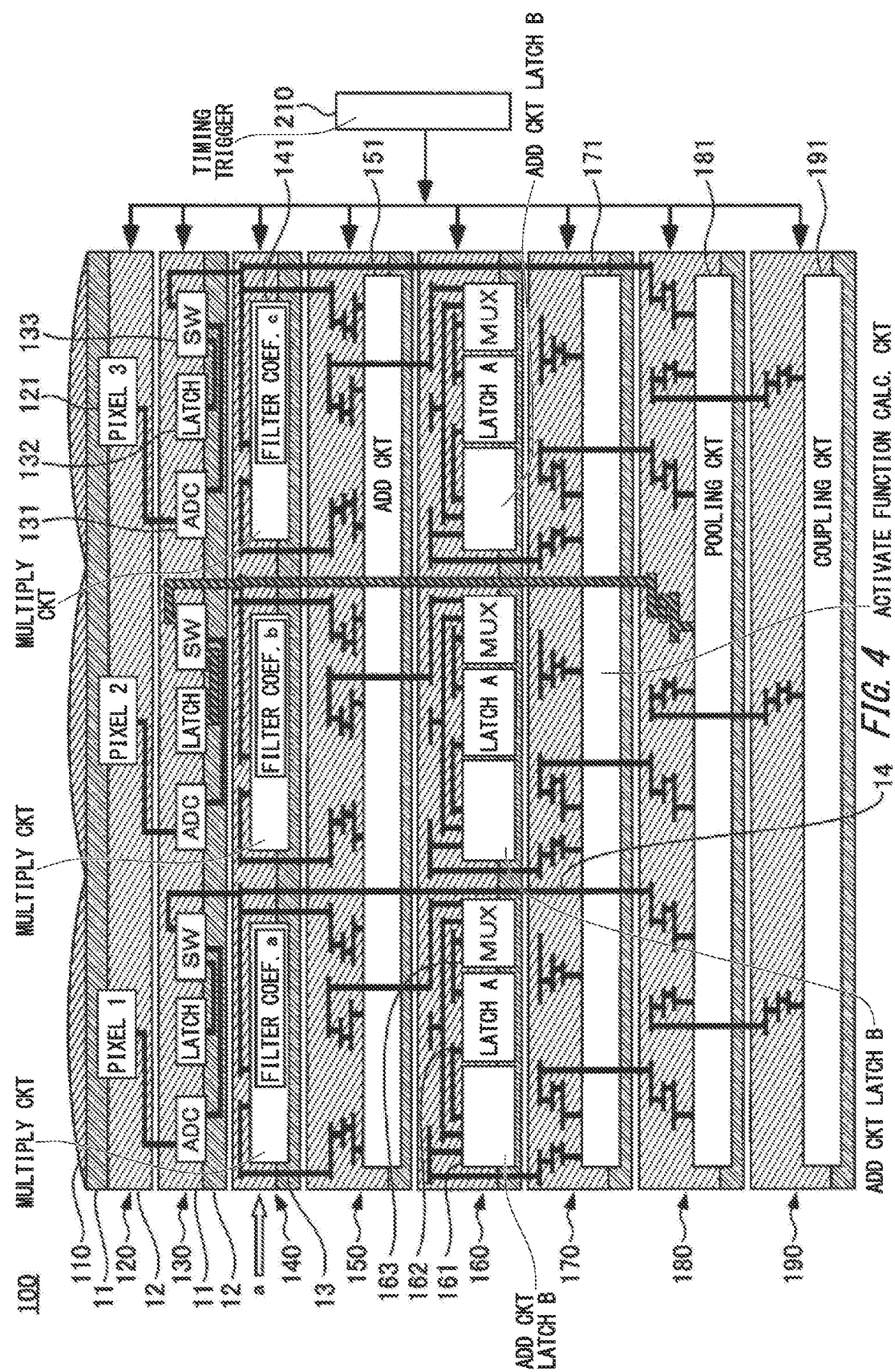
FIG. 4 is a schematic cross-sectional view of the feature extracting apparatus 100.

FIG. 4 is a view illustrating other operations in the feature extracting apparatus 100 shown in FIG. 1. In the feature extracting apparatus 100 shown in the figure, the through-electrode involved with operations described next is indicated emphasized with a hatched bold line.

As indicated with the bold line in the figure, in the feature extracting apparatus 100, signals can be transmitted and received also between substrates that are not adjacent to each other. Accordingly, for example, the output of the pooling circuit substrate 180 can be stored, through the through-electrode 14, in the latches 132 of the AD conversion circuit substrate 130 to be multiplied again in the multiplying circuits 141. Thereby, the convolution processing is again performed on the subsampled values. Such repeating convolution processing is performed predetermined times, e.g. 2000 times or above, with the filter coefficients a, b, c changing.

Furthermore, the signals processed up to the predetermined times among the AD conversion circuit substrate 130, the multiplying circuit substrate 140, the adding circuit substrate 150, the convolution operation result adding substrate 160, the activation function calculating circuit substrate 170, and the pooling circuit substrate 180, are turned into one-dimensional by the coupling circuit 191 in the coupling circuit substrate 190. Thereby, a value indicating certain feature quantity of the image for each component.

Figure 5:
FIG. 5 is a timing chart of the feature extracting apparatus 100.

FIG. 5 is a timing chart illustrating operations in the feature extracting apparatus 100. The pulses in the figure represent signals that are supplied to respective substrates as the timing triggers 210.

As shown in FIG. 5, each circuit in the feature extracting apparatus 100 is supplied with the timing trigger 210 sequentially from the uppermost layer in FIG. 1. Also, the multiplying circuit substrate 140 has the multiplying circuits 141 corresponding to the respective pixels 121, and thus, in the feature extracting apparatus 100, the processings performed in the order shown in FIG. 2 can be performed on the respective pixel values. Thereby, feature quantity of high judging accuracy can be extracted efficiently.

Note that a section P represents a section where the convolution processing S102 is repeated. A region surrounded by a dotted line A represents a section where convolution operation is performed with the same-sized filter on a group of pixels that configured of a plurality of pixels (e.g. 3×3 pixels). Furthermore, a region surrounded by a dotted line B represents a section where convolution operation is performed with other filters on the pixels in the same group.

Also, a section Q represents a section where the processings from the convolution processing S102 to the pooling processing S104 are repeated. Note that, in reality, in the operation result adding processing in the convolution processing S102, timing triggers of the latches A or the latch B-added adding circuits are supplied every time signals from the adding circuit are input, but, to simplify the description, a timing trigger of the final adding processing is only shown.

Note that processing load of the coupling processing in the coupling circuit 191 is smaller than that of the processings in the other substrates. Accordingly, the coupling circuit substrate 190 for the coupling circuit 191 may not be provided in the feature extracting apparatus 100. In this case, the feature extracting apparatus 100 outputs, to outside, signals that are repeated up to predetermined times and eventually pooling-processed in the pooling circuit 181. Then, the coupling processing is performed in an external substrate.

Figure 6:
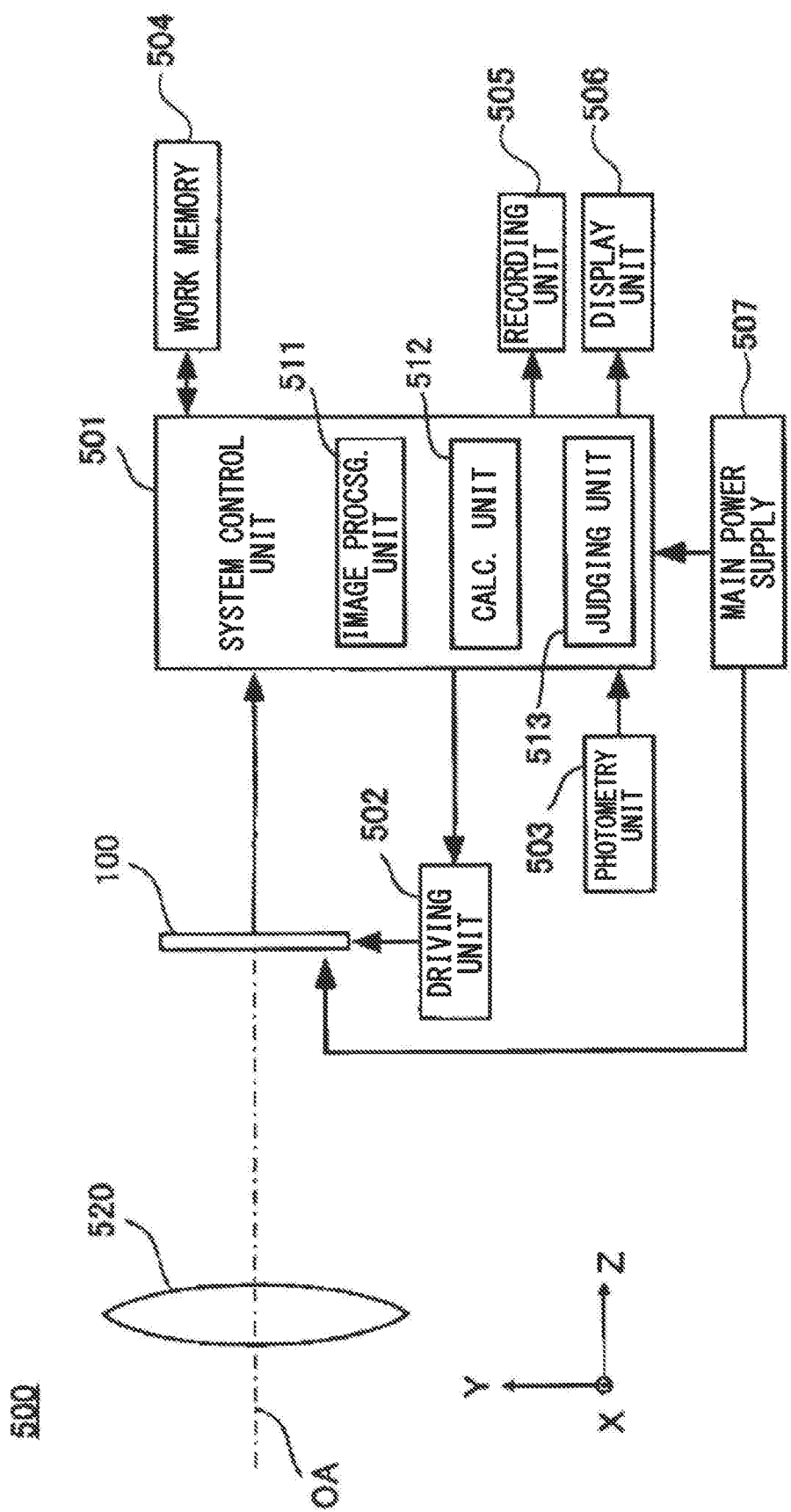
FIG. 6 is a block diagram of an imaging device 500.

FIG. 6 is a block diagram of an imaging device 500 that includes the feature extracting apparatus 100. The imaging device 500 includes a feature extracting apparatus 100, a system control unit 501, a driving unit 502, a photometry unit 503, a work memory 504, a recording unit 505, a display unit 506, and a main power supply 507.

Also, the imaging device 500 includes a main optical system 520 that leads an object luminous flux to the feature extracting apparatus 100. The main optical system 520 may be exchangeable so as to be attachable and detachable to the imaging device 500.

The main optical system 520 is configured of a plurality of groups of optical lenses, and images, near its focal plane, an object luminous flux from the object field. Note that, in the figure, the main optical system 520 is expressed by a single virtual representative lens arranged near the pupil.

The driving unit 502 is a control circuit to perform electrical charge accumulation control such as timing control, region control or the like of the feature extracting apparatus 100 according to instructions from the system control unit 501. The driving unit 502 performs, for example, a series of controls to make the feature extracting apparatus 100 accumulate electrical charge generated by photoelectrically converting the entering light to output the pixel value. Also, the driving unit 502 supplies the timing trigger 210 to the feature extracting apparatus 100.

Feature quantity of the object output from the feature extracting apparatus 100 is passed to the judging unit 513 of the system control unit 501. Thereby, in the system control unit 501, judging processing to judge an object is performed. Note that the feature extracting apparatus 100 may transmit, from the pixel substrate 120 to the image processing unit 511 of the system control unit 501, information including a luminance distribution of the object to generate an image data of the object. The image processing unit 511 performs processing with the work memory 504 as a workspace.

The photometry unit 503 detects a luminance distribution of the object, prior to a series of sequences to generate pixel values, by feature extracting apparatus 100 photoelectrically converting the entering light. The photometry unit 503 includes an AE sensor of about one million pixels, for example. The calculating unit 512 of the system control unit 501 calculates, upon receiving an output of the photometry unit 503, the luminance per region of a scene.

Furthermore, the calculating unit 512 determines the shutter speed, diaphragm value, ISO speed according to the calculated luminance distribution. The photometry unit 503 may be also used in common in the feature extracting apparatus 100. Note that the calculating unit 512 performs various types of necessary operations for making the imaging device 500 operate.

In such manner, the imaging device 500 has a judging function to judge an object by the feature quantity acquired from the feature extracting apparatus 100. Here, the feature extracting apparatus 100, in itself, transmits the extracted feature quantity to the system control unit 501. Accordingly, the system control unit 501 can acquire the feature quantity without taking load of the feature quantity extraction processing to judge the object. Also, the system control unit 501 receives feature quantity as the extraction result, and thus increase in the communication quantity between the feature extracting apparatus 100 and the system control unit 501 is prevented.

Figure 7:
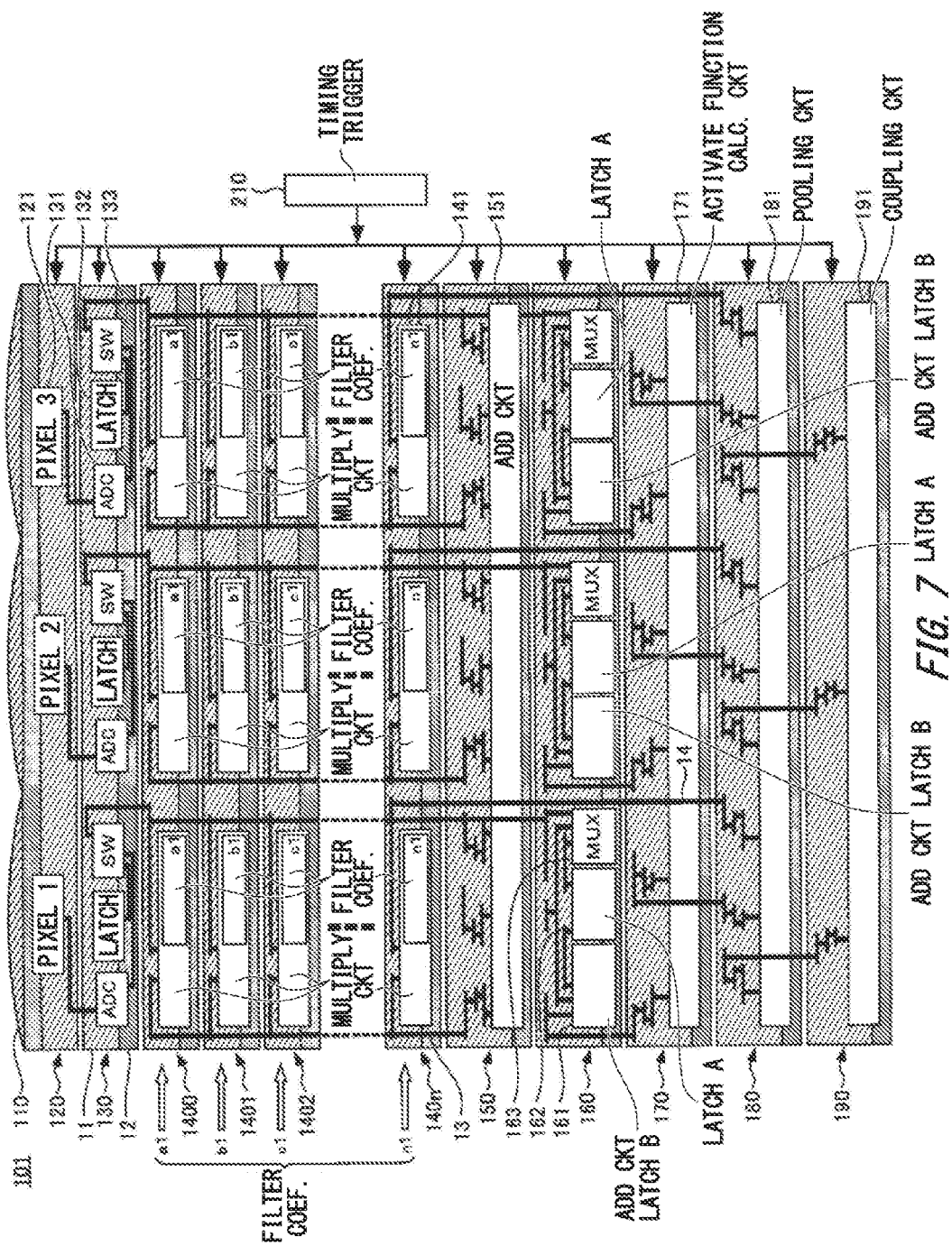
FIG. 7 is a schematic cross-sectional view of another feature extracting apparatus 101.

FIG. 7 is a schematic cross-sectional view of another feature extracting apparatus 101. The feature extracting apparatus 101 has the same structure as that of the feature extracting apparatus 100 shown in FIG. 1, excluding the part described next. The common elements are given the same reference numerals, and overlapping descriptions thereof will be omitted.

The feature extracting apparatus 101 has a different structure from that of the feature extracting apparatus 100 in a point that a plurality of multiplying circuit substrates 1400,

1401, 1402, ... , 140n are included between the AD conversion circuit substrate 130 and the adding circuit substrate 150. The plurality of multiplying circuit substrates 1400, 1401, 1402, ... , 140n, like the multiplying circuit substrate 1400 of the feature extracting apparatus 100, has a plurality of multiplying circuits 141 corresponding to the respective plurality of pixels 121 of the pixel substrate 120, and operates upon the timing when receiving a timing trigger 210 received from outside.

The multiplying circuit 141 acquires, from outside, filter coefficients for performing the multiplication processing to be held. Also, the multiplying circuit 141 can hold filter coefficients whose values are different for respective substrates and perform multiplication processing. Accordingly, the multiplying circuit substrates 1400 to 140n can perform multiplication processing under conditions different from each other.

Figure 8:
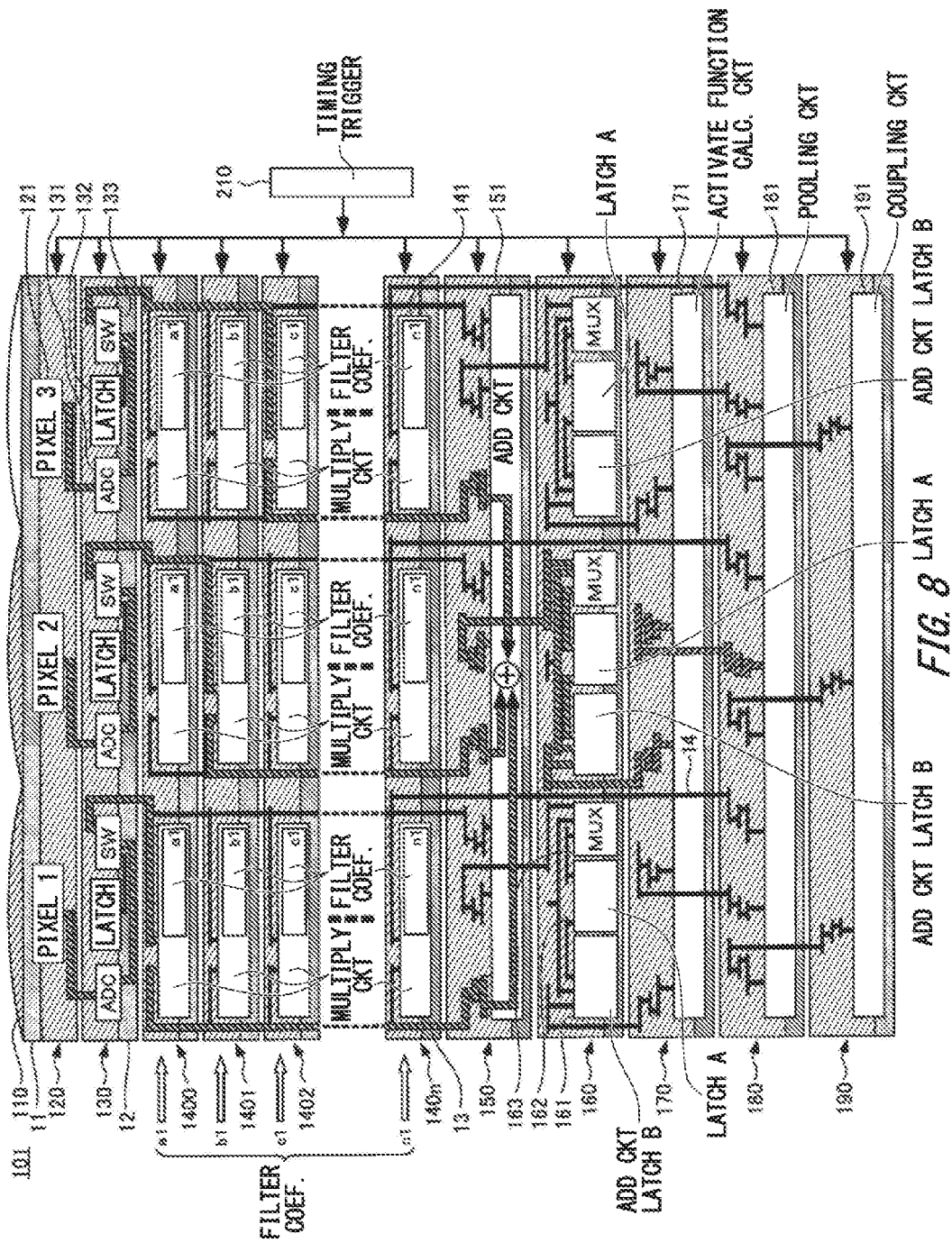
FIG. 8 is a schematic cross-sectional view of the feature extracting apparatus 101.

FIG. 8 is a schematic cross-sectional view illustrating operations in the feature extracting apparatus 101. As indicated with hatched bold lines in the figure, a pixel value output by the pixel 1 in the pixel substrate 120 is, after multiplied by the multiplying circuit 141 formed in the multiplying circuit substrate 1400 in the upper part in the figure, input to the adding circuit substrate 150 through the through-electrode 13. Also, a pixel value output by the pixel 2 in the pixel substrate 120 is, after multiplied by the multiplying circuit 141 formed in the multiplying circuit substrate 1401 in the upper part in the figure, input to the adding circuit substrate 150 through the through-electrode 13. Furthermore, a pixel value output by the pixel 3 in the pixel substrate 120 is, after multiplied by the multiplying circuit 141 formed in the multiplying circuit substrate 1402 in the upper part in the figure, input to the adding circuit substrate 150 through the through-electrode 13.

Note that respective filter coefficients a1 of the plurality of multiplying circuits 141 provided in the multiplying circuit substrate 1400 take the same value among the multiplying circuits 141 provided in the same multiplying circuit substrate 1400. Similarly, in the other multiplying circuit substrates 1401, 1402, ... , 140n, a plurality of multiplying circuits 141 in each substrate has common filter coefficients b1, c1, ... , n1. Accordingly, if performing the convolution processing, the filter coefficients a1, b1, c1, ... , n1 can be selected by selecting substrates to perform the multiplication processing. In other words, in the example shown in FIG. 8, a pixel value output by the pixel 1 is multiplied by the filter coefficient a1, a pixel value output by the pixel 2 is multiplied by the filter coefficient b1, and a pixel value output by the pixel 3 is multiplied by the filter coefficient c1.

Figure 9:
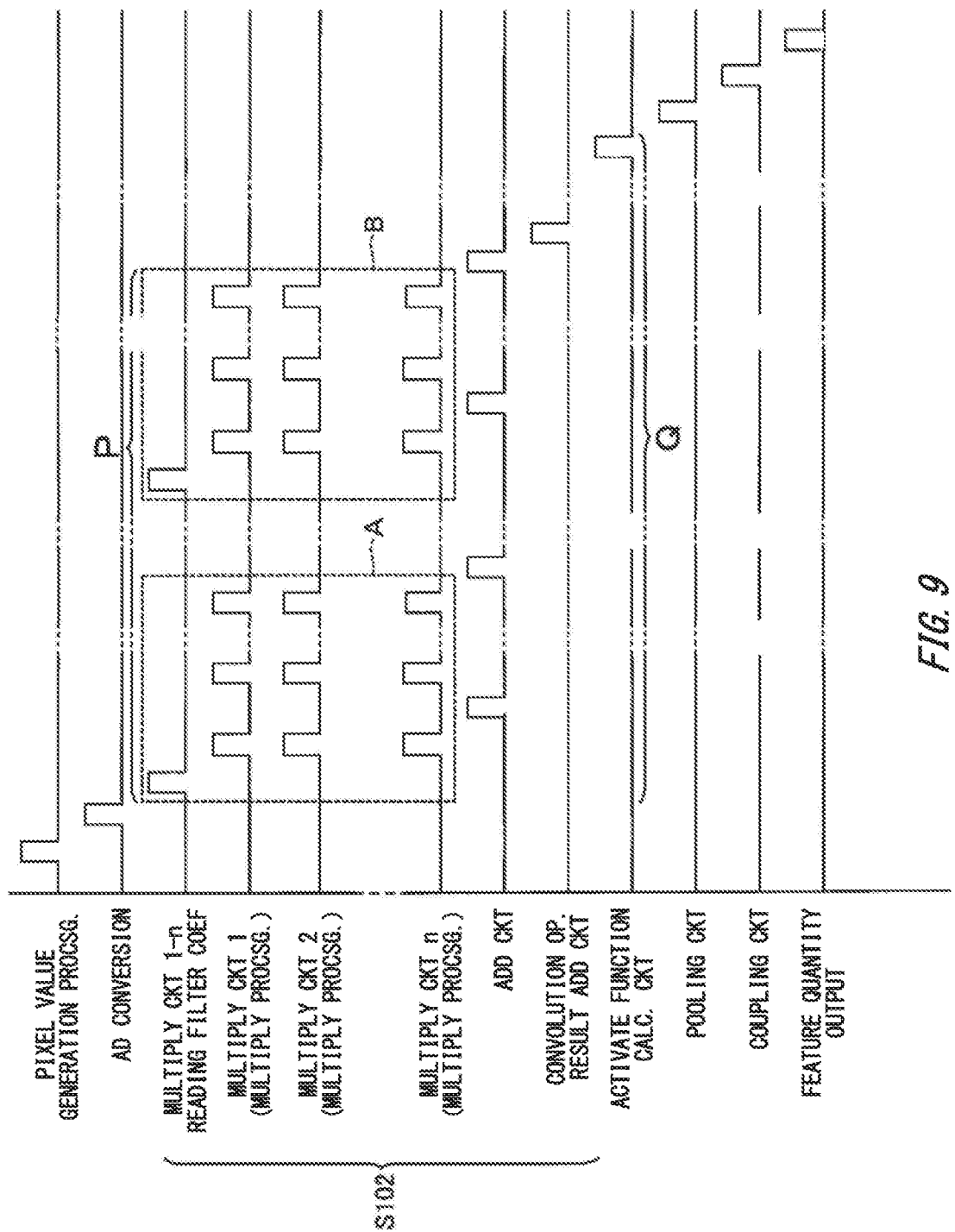
FIG. 9 is a partial timing chart of the feature extracting apparatus 101.

FIG. 9 is a partial timing chart of the feature extracting apparatus 101. In the feature extracting apparatus 101, pixels 121 are multiplied by different multiplying circuit substrates 1400 to 140n, respectively. Accordingly, after acquiring all the filter coefficients first, the multiplication processing that is performed many times in the convolution processing equivalent to one single filtering for a group of pixels can be performed in parallel and simultaneously, and sequentially as indicated with dotted lines A and B in the figure.

Accordingly, there is no need to acquire and set the filter coefficients every time when performing the multiplication processing, leading to shorter time to acquire and set the filter coefficients, and thus throughput of the feature extracting apparatus 101 as a whole can be improved. Such feature extracting apparatus 101 can be used, for example, as an image sensor with a feature extraction function by incorporating the feature extracting apparatus 101 into the imaging device 500 as an alternative to the feature extracting apparatus 100.

The feature extracting apparatus described in the present embodiment has the multiplying circuit 141, the adding circuit 151, the activation function calculating circuit 171, the pooling circuit 181, and the coupling circuit 191 arranged respectively in the multiplying circuit substrate 140, the adding circuit substrate 150, the activation function calculating circuit substrate 170, the pooling circuit substrate 180, and the coupling circuit substrate 190. However, the feature extracting apparatus may not necessarily have only one single circuit for one single substrate provided. In other words, one single substrate may have a plurality of circuits arranged therein, or one single circuit may be arranged over a plurality of substrates.

Also, the lamination order of the plurality of substrates in the feature extracting apparatus is not limited to the example described above, as long as they can be arranged using through-electrodes. Furthermore, the convolution operation result adding substrate 160 is not limited to the example described above, as long as it is configured to add a plurality of values to be held.

Also, the feature extracting apparatus described in the present embodiment enables, with a single sensor of a laminated structure, feature extraction using convolution neural networks to perform the convolution processing in multi-layer neural networks. Note that, by using the same value for the filter coefficient of the convolution processing that is performed a plurality of times, it is also possible to achieve recursive convolution neural networks. Note that methods are not limited to these, as long as feature extraction can be performed by the feature extracting apparatus in the present embodiment.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A feature extracting element, comprising:
   a light-receiving substrate where a plurality of light-receiving elements for photoelectrically converting received light are two-dimensionally arrayed; and
   one or more other substrates that are laminated on the light-receiving substrate, wherein the one or more other substrates have:
   an AD conversion circuit substrate to receive signals generated by the plurality of light-receiving elements and to convert the signals received from the plurality of light-receiving elements;
   a convolution processor, connected to the light-receiving substrate via the AD conversion circuit substrate, having a plurality of multiplying circuits that are correspondingly provided per the light-receiving element or per a block that is configured of more than one light-receiving element among the plurality of the light-receiving elements, and performs a convolution operation using the plurality of multiplying circuits on the signals that are output from the AD conversion circuit substrate directly to the plurality of multiplying circuits; and a pooling circuit to sample a signal that is output from the convolution processor, based on a predetermined condition.

2. The feature extracting element according to claim 1, further comprising:

a connection wiring to pass the signal that is sampled to the plurality of multiplying circuits, wherein the convolution processor and the pooling circuit each are provided in substrates different from each other, among the plurality of other substrates, and the connection wiring includes a through-electrode to connect the substrates different from each other.

3. The feature extracting element according to claim 1, having:

a plurality of multiplying circuit substrates that are laminated on each other as the other substrates, and wherein the plurality of multiplying circuits are provided in multiplying circuit substrates that are different from each other, among the plurality of multiplying circuit substrates.

4. The feature extracting element according to claim 3, wherein filter coefficients being different from each other for the convolution operation are set for the plurality of multiplying circuit substrates.

5. The feature extracting element according to claim 1, wherein the convolution processor has an adding circuit to sum up outputs from the plurality of multiplying circuits that are respectively provided corresponding to the plurality of light-receiving elements; and the adding circuit is provided in an adding circuit substrate that falls in the one or more other substrates.

6. The feature extracting element according to claim 1, further comprising:

a connection wiring to pass the signal that is sampled to the plurality of multiplying circuits;

a latch circuit to hold a signal from at least one light-receiving element among the plurality of light-receiving elements; and a read-out circuit to read out the signal from the at least one light-receiving element, wherein the read-out circuit is provided in a read-out substrate that falls in the one or more other substrates, and the connection wiring connects between the pooling circuit and the latch circuit.

7. The feature extracting element according to claim 1, wherein the one or more other substrates have an activation function calculation processing unit to input, to an activation function, a signal on which the convolution operation is performed to output a resultant output signal to the pooling circuit.

8. The feature extracting element according to claim 1, wherein signals output from the plurality of light-receiving elements are output to outside.

9. A feature extracting system, comprising:

the feature extracting element according to claim 1; and a controller to control such that the convolution operation of the convolution processor and the sampling of the pooling circuit are repeated, wherein the controller controls, when the convolution operation is repeated, the convolution processor such that predetermined filter coefficients are respectively used.

10. A judging apparatus, comprising:

the feature extracting element according to claim 1; and a controller to judge an image-capturing target by a feature quantity that is extracted based on an output from the pooling circuit.

11. A feature extracting element, comprising:

a light-receiving substrate where a plurality of light-receiving elements for photoelectrically converting received light are two-dimensionally arrayed; and one or more other substrates that are laminated on the light-receiving substrate, wherein the one or more other substrates have:

a convolution processor which has a plurality of multiplying circuits that are correspondingly provided per the light-receiving element or per a block that is configured of the plurality of the light-receiving elements, and performs a convolution operation on signals that are output from the plurality of light-receiving elements using the plurality of multiplying circuits; and a pooling circuit to sample a signal that is output from the convolution processor, based on a predetermined condition, wherein the convolution processor and the pooling circuit each are provided in substrates different from each other, among the plurality of other substrates.

12. A feature extracting element, comprising:

a light-receiving substrate where a plurality of light-receiving elements for photoelectrically converting received light are two-dimensionally arrayed; and one or more other substrates that are laminated on the light-receiving substrate, wherein the one or more other substrates have:

a convolution processor which has a plurality of multiplying circuits that are correspondingly provided per the light-receiving element or per a block that is configured of the plurality of the light-receiving elements, and performs a convolution operation on signals that are output from the plurality of light-receiving elements using the plurality of multiplying circuits, and a pooling circuit to sample a signal that is output from the convolution processor, based on a predetermined condition, wherein the one or more other substrates include a plurality of multiplying circuit substrates laminated on each other, and the plurality of multiplying circuits are provided in multiplying circuit substrates that are different from each other, among the plurality of multiplying circuit substrates.

13. A feature extracting system, comprising:

a feature extracting element, including:

a light-receiving substrate where a plurality of light-receiving elements for photoelectrically converting received light are two-dimensionally arrayed, and one or more other substrates that are laminated on the light-receiving substrate, wherein the one or more other substrates have:

a convolution processor which has a plurality of multiplying circuits that are correspondingly provided per the light-receiving element or per a block that is configured of the plurality of the light-receiving elements, and performs a convolution operation on signals that are output from the plurality of light-receiving elements using the plurality of multiplying circuits, and a pooling circuit to sample a signal that is output from the convolution processor, based on a predetermined condition; and a controller to control such that the convolution operation of the convolution processor and the sampling of the pooling circuit are repeated, wherein the controller controls, when the convolution operation is repeated, the convolution processor such that different filter coefficients are respectively used.

\* \* \* \* \*